United States Patent [19]

Doran

[11] Patent Number: 5,615,412

[45] Date of Patent: Mar. 25, 1997

[54] DIGITAL SQUELCH TAIL SYSTEM AND METHOD FOR SAME

[75] Inventor: Patrick J. Doran, Plantation, Fla.

[73] Assignee: Motorola, Inc., Schaumburg, Ill.

[21] Appl. No.: 509,561

[22] Filed: Jul. 31, 1995

[51] Int. Cl.$^6$ ..................................... H04B 1/10

[52] U.S. Cl. ................ 455/222; 455/213; 375/351; 375/217

[58] Field of Search ................... 455/222, 219, 455/220, 200.1, 194.1, 212, 213, 221; 379/390, 395; 375/346, 350, 351, 217; 381/56, 57

[56] References Cited

U.S. PATENT DOCUMENTS

| | | | |
|---|---|---|---|
| 4,411,021 | 10/1983 | Yoakum | 455/222 |
| 4,908,855 | 3/1990 | Ohga et al. | 379/395 |
| 5,023,940 | 6/1991 | Johnson et al. | 455/212 |
| 5,113,400 | 5/1992 | Gould et al. | 371/43 |
| 5,199,109 | 3/1993 | Baker | 455/222 |
| 5,303,407 | 4/1994 | Juergensen et al. | 455/222 |
| 5,303,408 | 4/1994 | Ghomeshi et al. | 455/222 |
| 5,333,153 | 7/1994 | Brown et al. | 455/222 |
| 5,369,791 | 11/1994 | Asghar et al. | 455/222 |
| 5,459,750 | 10/1995 | Hiotakakos et al. | 455/222 |
| 5,483,690 | 1/1996 | Schroder | 455/222 |
| 5,485,522 | 1/1996 | Solve et al. | 381/56 |

FOREIGN PATENT DOCUMENTS

WO93/15559  8/1993  WIPO ................... 455/222

*Primary Examiner*—Reinhard J. Eisenzopf
*Assistant Examiner*—Lester G. Kincaid
*Attorney, Agent, or Firm*—Andrew S. Fuller

[57] ABSTRACT

A digital squelch tail system (120, 114) selectively attenuates audio output corresponding to a digital signal (156). A bit error rate estimator (210) generates bit error rates (201) for an input digital signal (156). A digital filter (220) coupled to the bit error rate estimator (210) outputs an error variation rate (202) related to a rate of change of the bit error rate. Audio output derived, at least in part, from the digital signal (156), is selectively attenuated with an attenuation rate based on the output (202) of the digital filter (220).

15 Claims, 2 Drawing Sheets

DIGITAL SQUELCH TAIL SYSTEM AND METHOD FOR SAME

CROSS REFERENCE TO RELATED APPLICATIONS

This application is related to issued U.S. Pat. No. 5,113,400, issued to Gould, et al., on May 12, 1992, entitled "AN ERROR DETECTION SYSTEM," and assigned to Motorola, Inc.

TECHNICAL FIELD

This invention relates in general to communication systems, and more particularly, to squelch systems used to suppress noise during communications.

BACKGROUND OF THE INVENTION

Many radio communication devices, such as two-way portable transceivers are equipped with a squelch circuit to disable audio output when a communication channel being monitored has unacceptable levels of noise. In a typical radio, a communication channel is monitored to detect a communication signal. For example, a communication signal may represent voice communication. If the detected signal is above a particular threshold, the radio's audio output is unmuted to provide a decoded output of the detected signal. When the communication signal is no longer detected, the radio's audio output is muted to avoid outputs attributable to noise on the communication channel. Additionally, during typical communication sessions, a communication signal level may become weak, such that a signal level to noise ratio (S/N) falls below a particular threshold, thereby resulting in the muting of the radio's audio output.

Abrupt muting of a radio's audio output may not be ideal in certain communication environments. For example, if the radio is being operated under weak signal conditions, the signal to noise ratio may periodically drop below the mute threshold value which may result in undesirable muting and unmuting operations. For example, fluctuations in detected signal level may result in the radio muting prematurely. Premature muting may result in portions of the communication signal being lost. Yet, the muting threshold level must be set to disable audio output under noisy channel conditions, or when a communication signal is no longer present on the channel.

One solution to the problem of premature or undesirable muting of a radio's audio output is a provision of a variable time delay for mute operations. A variable time delay may allow a very weak signal to fluctuate without premature muting. Variable time delay muting may be provided by a squelch tail circuit. A squelch tail circuit usually varies the delay time for muting operations depending on a detected signal strength. For example, a squelch tail circuit may cause the abrupt muting of a radio's audio output upon detection of a loss of signal immediately following the detection of a strong signal. On the other hand, upon detection of a weak signal, the squelch tail circuit may provide a relatively long time delay before muting, the assumption being that periodic signal loss may be resulting from fluctuations of a weak signal.

In a typical squelch tail circuit of the prior art, a comparison is made between the strength of a communication signal, such as an audio signal, and the level of noise detected with that signal, to govern the activation of audio output muting. The provision of a squelch tail circuit typically requires dedicated circuitry that measures S/N for comparisons against a threshold. The measurement of S/N is quite common in an analog signal processing environment.

Many modem radios now employ digital signaling to effect communications on a communication channel. A substantial portion of analog signal processing has been carried over to systems employing digital signal processing. For example, U.S. Pat. No. 5,303,407 issued to Juergensen, et al., on Apr. 12, 1994, for A DIGITAL SQUELCH TAIL CIRCUIT FOR TWO-WAY RADIO COMMUNICATION SYSTEMS, describes a squelch tail circuit that uses a digital timer to provide a time delay based upon a feedback comparisons to determine time delay periods for muting audio output corresponding to weak and strong signals. In another example, described in U.S. Pat. No. 5,023,940, issued to Johnson, et al., on Jun. 11, 1991, for A LOW-POWER DSP SQUELCH, a statistically evaluation of a received digital signal is used to determine whether the communication channel contains signal or noise, and this information is used in determining operation of a squelch circuit. In a third example, such as that described in U.S. Pat. No. 5,303,408, issued to Ghomeshi, et al., on Apr. 12, 1994, for A SQUELCH DETECTOR, a communication device includes a digital signal processor to measure the level of signal energy in various segments of frequency spectrum of a received signal to dynamically establish a squelch threshold. In all three examples, a measurement or approximation of signal energy and noise energy is used in determining when to squelch.

Digital communication systems can provide improved communication efficiency by applying a substantial amount of logic to the processing of received signals. Such additional signal processing capability is not fully utilized in many of today's communication systems that attempt to remove unwanted noise from audio outputs of received digital signals. Therefore, it is desirable to provide an improved digital squelch tail system that more fully utilizes the signal processing capabilities associated with digital signals.

DETAILED DESCRIPTION OF THE PREFERRED EMBODIMENT

Figure 1:
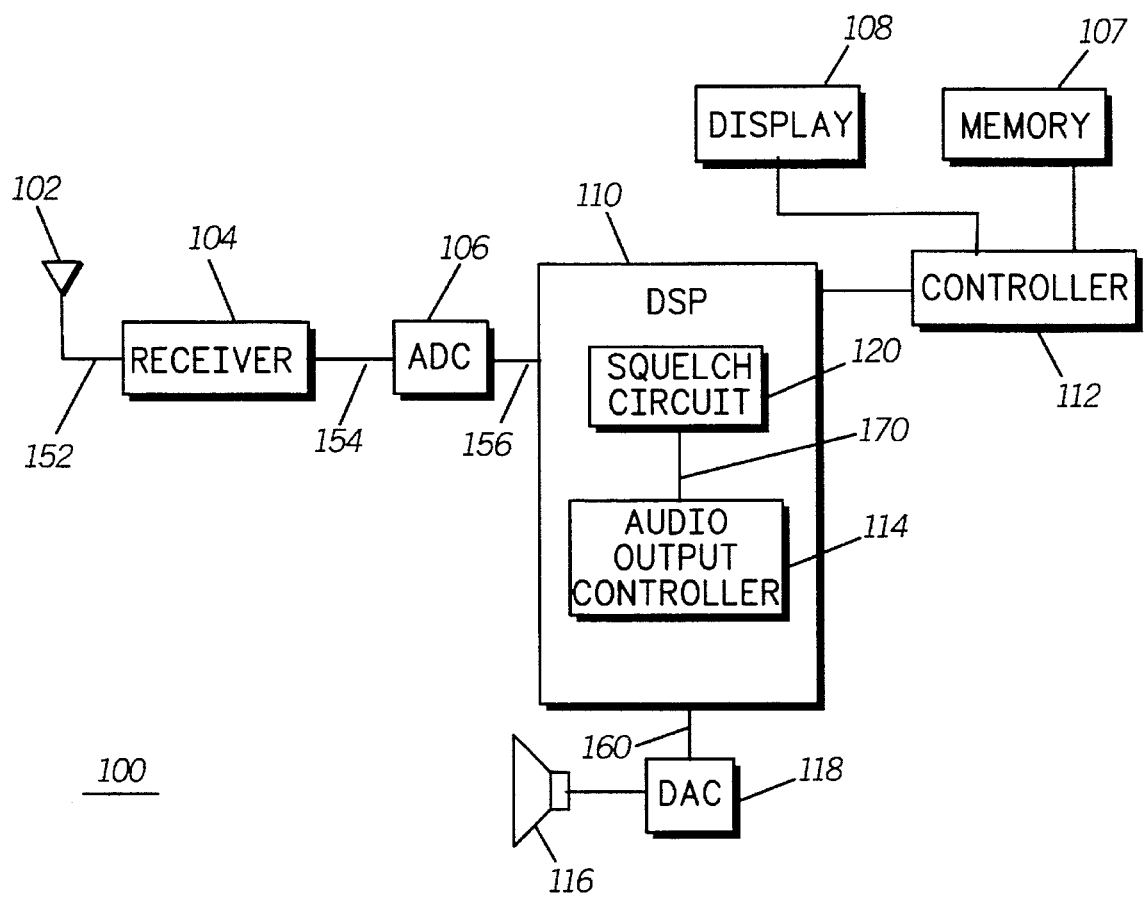
FIG. 1 is a block diagram of a communication device in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides a squelch tail system for selectively attenuating audio output corresponding to a digital signal. The digital signal squelch tail system includes a bit error rate estimator to determine bit error rates of a digital input signal, a digital filter having an output related to a rate of change for the bit error rate of the digital signal, and an output device having audio output derived, at least in part, from the digital signal. The audio output is attenuated with an attenuation rate based on the output of the digital filter.

Referring now to FIG. 1, a block diagram of a communication device 100, is shown in accordance with the present invention. The communication device 100 is a portable two-way radio unit that communicates using radio frequency (RF) signals. Accordingly, the communication device 100 includes an antenna 102 that is coupled to a receiver 104. When the receiver 104 is tuned to a particular communication channel, the antenna 102 receives modulated RF signals 152 modulated on a carrier frequency, and the receiver demodulates the received signal 152 to extract an information signal 154, generally in analog form. The receiver 104 is coupled to an analog to digital converter (ADC) 106 that converts the information signal 154 to digital form. The information signal 154 is then presented as a digital input signal 156 to a digital signal processor (DSP) 110. The DSP 110 performs audio signal processing on the digital input signal 156, and may include such functions as a speech decoder, to produce voice signals from the digital input signal 156. The operation of a DSP is well known in the art. In the preferred embodiment, the DSP 110 is used to process the received signal, in the form of the digital input signal 156, along with a variety of other functions. Notably, the DSP 110 includes a squelch circuit 120 which implements a significant portion of a digital squelch tail system. The squelch circuit 120 provides signals 170 to support a gating function for an audio output controller 114. The DSP 110 also includes an audio output controller 114 that controls muting and unmuting characteristics for audio output from an audio output device, such as speaker 116.

The communication device 100 further includes a controller 112 that operates under control of programming information stored in memory 107. The controller 112 communicates with the DSP 110 to receive data components derived from the received signal. Upon further processing of the data components, the controller 112 operates to perform a particular radio function, such as to present an output to the operator of the radio unit in the form of visual data presented on display device 108, or audio data presented via speaker 116. Audio data or signals 160 are routed, under the control of the audio output controller 114, from the DSP 110 via a digital to analog converter (DAC) 118 to the speaker 116. The audio output controller 114 operates in conjunction with the squelch circuit 120. In the preferred embodiment the squelch circuit 120 is implemented by instructions executed by the DSP 110. Note that identification of the squelch circuit 120 as a separate block in this description is solely intended to facilitate the understanding of the present invention. As such, the elements of the squelch circuit 120 and/or the functions thereof can be implemented in a variety of forms according to the concepts of the present invention.

Figure 2:
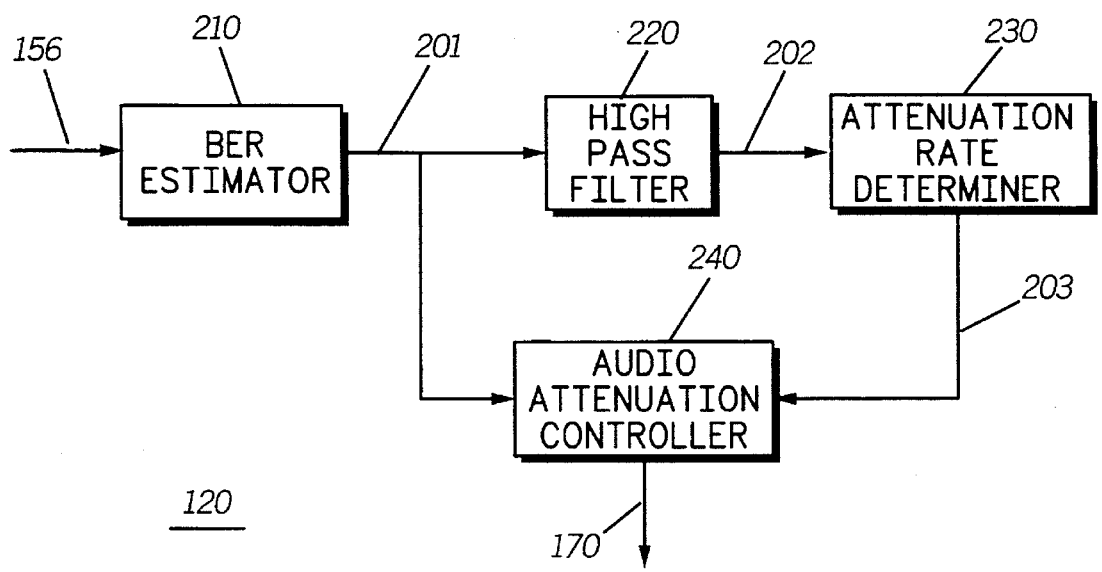
FIG. 2 is a block diagram of a digital squelch system, in accordance with the present invention.

Referring to FIG. 2, a block diagram highlighting elements of the squelch circuit 120 is shown, in accordance with the present invention. The squelch circuit includes a channel bit error rate (BER) estimator 210, a high pass filter (HPF) 220, an attenuation rate determiner 230, and an audio attenuation controller 240. The BER estimator 210 determines the rate of error for digitized information received via the tuned communication channel. In the preferred embodiment, the BER estimator 210 compares equal length frames of two separate bit streams received over a particular time interval. One of the bit streams is derived from raw or uncorrected digital data received on the communication channel (received channel bits), as determined from the receiver's output, which is potentially corrupted by channel errors. The other is a corrected bit stream which comes from re-encoding decoded bits obtained using an error correction scheme such as Viterbi decoding. The Viterbi decoding process produces a high quality estimate of the channel bits that were transmitted on the communication channel. The BER estimator 210 calculates the number of bit errors by counting the number of bits that differ between the received channel bits and the error corrected estimate of the transmitted channel bits. The bit error rate estimate is the number of bit errors divided by the total number of bits in a frame. This method of determining bit error rate is fully described in U.S. Pat. No. 5,113,400, issued to Gould, et al., on May 12, 1992, for AN ERROR DETECTION SYSTEM, the contents of which are hereby incorporated by reference. The BER estimator 210 has an input coupled to the digital input signal 156 and produces an output 201 representing a bit error rate for the digital input signal 156.

The HPF 220 is a digital filter having input coupled to the output of the bit error rate estimator. In the preferred embodiment, the HPF 220 is a two-pole finite impulse-response high-pass filter with a zero-th order coefficient of one, and first and second order coefficients of −0.5, i.e., $$H(z)=1-0.5z^{-1}0.5z^{-2}.$$

Here, the HPF 220 is dependent on the current bit error rate value and two prior bit error rate values. The HPF 220 produces an output 202 related to, or representing, a rate of change for the bit error rate of the digital input signal 156. The output 202 of the HPF 220 is a series of discrete values that range from a low value to a high value. A higher value for the output 201 corresponds to a greater the rate of change for the bit error rate. The output 202 of the HPF 220 is used by the attenuator rate determiner 230. The attenuator rate determiner 230 uses the discrete value output of the HPF 220 to determine an attenuation rate for squelch operations. Generally, the attenuation rate is higher when the output 202 of the HPF 220 is higher, and lower when the output 202 has a low value. Outputs 201, 203 from the BER estimator 210 and the attenuation rate determiner 230, respectively, are used by the audio attenuator controller 240 to selectively attenuate the audio output of the radio communication device 100.

Figure 3:
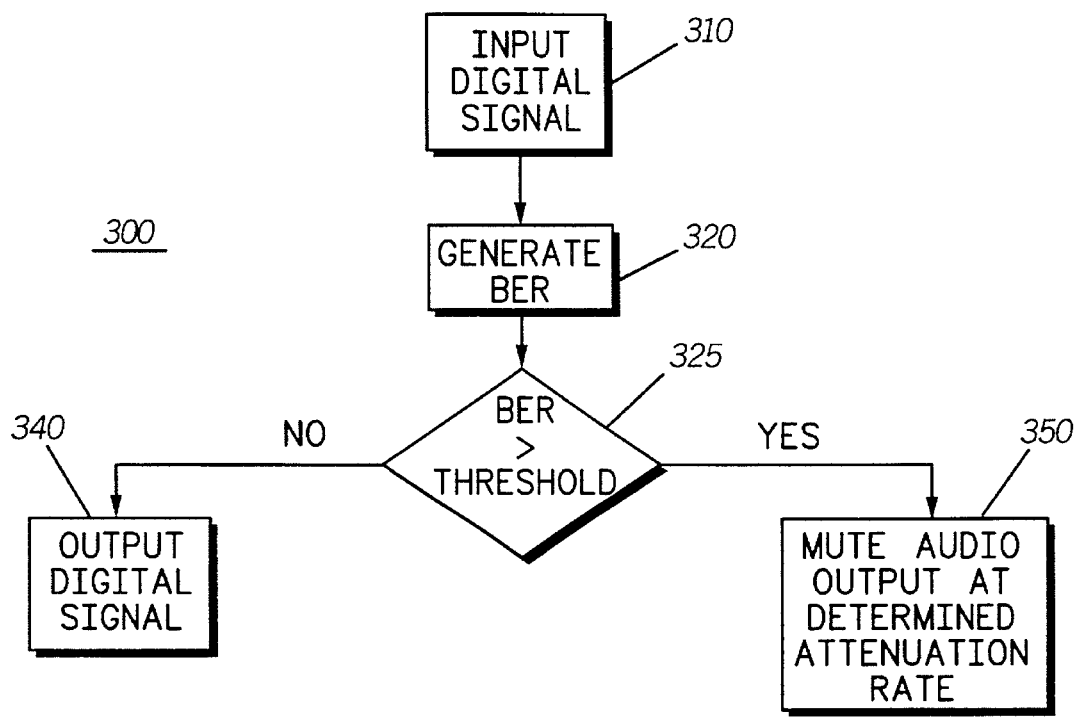
FIG. 3 is a flowchart of procedures used to determine when to mute audio output, in accordance with the present invention.

FIG. 3 is a flowchart of procedures 300 for a squelch decision, in accordance with the present invention. Referring to FIGS. 2 and 3, the BER estimator 210 receives an input digital signal and generates therefrom a bit error rate estimate, steps 310, 320. As described above, the BER estimator 210 generates bit error rates for portions of the digital input signal by comparing equal length frames of a raw bit stream and an error corrected version of the same bit stream. The raw bit stream is received over a particular time interval representing a portion of the digital signal. If the bit error rate does not exceed a particular predetermined threshold value, the digital input signal is outputted, steps 325, 340. If the bit error rate exceeds the predetermined threshold value, the audio output is squelched or muted at a determined attenuation rate, step 350.

Figure 4:
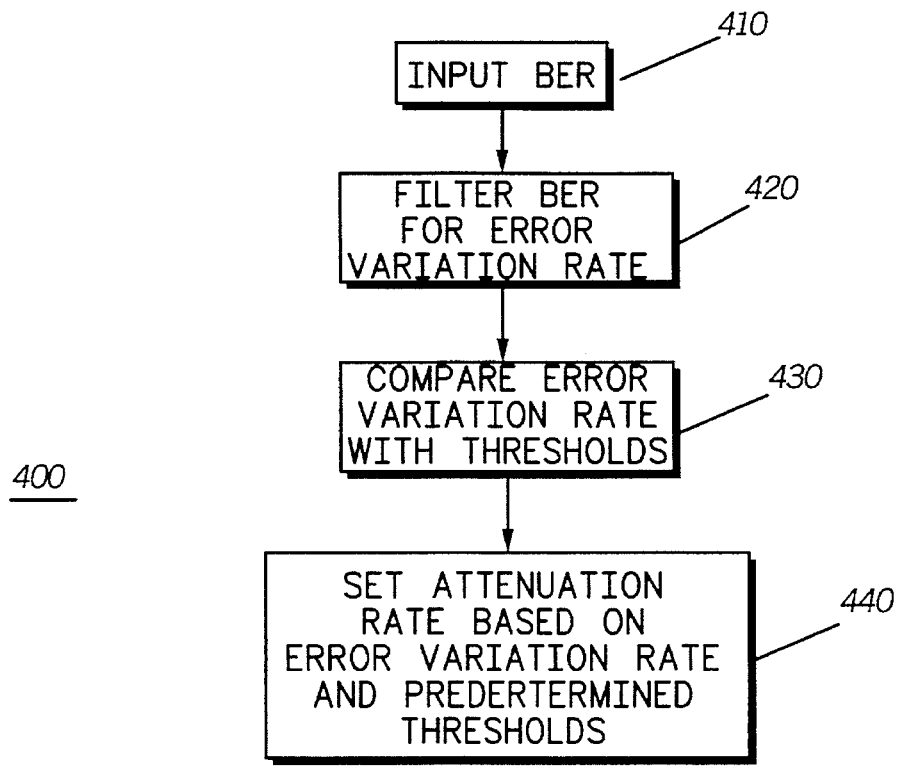
FIG. 4 is a flowchart of procedures used in determining the attenuation rate of audio muting, in accordance with the present invention.

Referring to FIG. 4, a flowchart of procedures 400 for determining the attenuation rate is shown, in accordance with the present invention. Referring to FIGS. 2 and 4, the output of the BER estimator 210 provides an input 201 to the digital high pass filter 220, step 410. Bit error rates are generated for successive portions of the digital signal to produce a stream of discrete values. The incoming stream of input bit error rates are filtered by the high pass filter 220 to determine an error variation rate which is a stream of discrete values related to a rate of change of the bit error rate, step 420. The output 202 of the digital high pass filter 220, i.e., the error variation rate, is compared against a set of error variation rate threshold values, step 430, to determine attenuation rate. When the error variation rate exceeds the error variation rate threshold value, a particular attenuation rate is selected that corresponds to the error variation rate threshold value, step 440. The audio output is muted at the particular attenuation rate corresponding to the error variation rate, when the bit error rate exceeds a corresponding error rate threshold value.

The present invention provides for a significant benefit over the prior art. For example, the procedures described with respect to the present invention can be implemented using existing hardware elements already present in a radio communication device that does error correction on digital input signals. In the preferred embodiment, the BER estimator 210, the high pass filter 220, the attenuator rate determiner 230, and the attenuation rate controller 240, are all implemented using software procedures executed by the DSP 110, and/or the controller 112. The BER estimator 210 provides an effective means of determining when channel conditions affect the digitally transmitted signal. This is potentially more accurate for digital communications than the S/N that has been used in the prior art to make squelch tail determinations. The filter 220 can be designed to accommodate various levels of sensitivity to channel conditions and may be fine tuned for particular applications. Moreover, such squelch tail decision parameters could be designed so as to be user programmable and thus adaptable to a specific communication need.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A digital squelch tail system for selectively attenuating audio output corresponding to a digital signal, comprising:

a bit error rate estimator having an input coupled to the digital signal, and having an output representing a bit error rate for the digital signal;

a digital filter having an input coupled to the output of the bit error rate estimator, the digital filter having an output based on a rate of change for the bit error rate of the digital signal; and an output device having an audio output derived, at least in part, from the digital signal, wherein the audio output is selectively attenuated with an attenuation rate based on the output of the digital filter.

2. The digital squelch tail system of claim 1, wherein:

the bit error rate estimator compares a first bit stream of uncorrected digital data with a second bit stream of corrected digital data to provide a bit error rate estimate.

3. The digital squelch tail system of claim 2, wherein the digital filter has an output value dependent on a current bit error rate value and at least two prior bit error rate values.

4. The digital squelch tail system of claim 3, wherein the output of the digital filter comprises discrete values.

5. The digital squelch tail system of claim 4, wherein:

the output of the digital filter varies from a first value to a second value higher than the first value; and the attenuation rate of the audio output is higher when the output of the digital filter is the second value than when the output of the digital filter is the first value.

6. The digital squelch tail system of claim 1, wherein the digital filter comprises a digital high pass filter.

7. A radio communication device having a digital squelch tail system for selectively attenuating audio output, comprising:

a radio receiver responsive to a modulated signal to produce a received digital signal;

an error rate estimator coupled to the received digital signal and having an error rate output;

a digital high pass filter coupled to error rate output and having an error variation rate output based on a rate of change of the error rate output;

an audio output device having an input based on the received digital signal and having an audio output; and an audio output controller coupled to the audio output device and coupled to the digital high pass filter, and being responsive to attenuate audio output based, at least in part, on the error variation rate output.

8. The radio communication device of claim 7, wherein:

the audio output has an attenuation rate that varies based on the error variation rate output.

9. The radio communication device of claim 8, wherein the error variation rate output comprises discrete values.

10. The radio communication device of claim 9, wherein:

the error variation rate output varies from a first value to a second value higher than the first value; and the attenuation rate of the audio output is higher when the error variation rate output has the second value than when the error variation rate output has the first value.

11. A method for selectively attenuating audio output corresponding to a digital signal, comprising the steps of:

generating bit error rates for portions of the digital signal;

filtering the bit error rates to determine an error variation rate based on rate of change of the bit error rates;

generating audio output derived, at least in part, from the digital signal; and selectively attenuating the audio output with an attenuation rate based on the error variation rate.

12. The method of claim 11, wherein the step of generating bit error rates comprises the step of generating bit error rates for successive portions of the digital signal.

13. The method of claim 11, wherein the step of filtering comprises the step of filtering the bit error rates with a high pass filter to produce a discrete value representing the error variation rate.

14. The method of claim 13, wherein the step of selectively attenuating the audio output comprises the steps of:

comparing at least one bit error rate with an error rate threshold value;

comparing the error variation rate with an error variation rate threshold value;

selecting a particular attenuation rate corresponding to the error variation rate threshold value when the error variation rate exceeds the error variation rate threshold value; and muting the audio output at the particular attenuation rate, when the at least one bit error rate exceeds the error rate threshold value.

15. The method of claim 13, further comprising the step of generating the digital signal from a modulated signal received by a radio receiver.

* * * * *